United States Patent [19]
Copeland, III

[11] 4,189,739
[45] Feb. 19, 1980

[54] SEMICONDUCTOR OVERLOAD PROTECTION STRUCTURE

[75] Inventor: John A. Copeland, III, Fair Haven, N.J.

[73] Assignee: Bell Telephone Laboratories, Incorporated, Murray Hill, N.J.

[21] Appl. No.: 884,414

[22] Filed: Mar. 8, 1978

[51] Int. Cl.² .............................................. H01L 27/02
[52] U.S. Cl. ........................................ 357/51; 357/13; 357/23; 357/41
[58] Field of Search ........................ 357/13, 23, 41, 51

[56] References Cited
U.S. PATENT DOCUMENTS
3,967,295  6/1976  Stewart ................................ 357/42

Primary Examiner—Edward J. Wojciechowicz
Attorney, Agent, or Firm—Irwin Ostroff

[57] ABSTRACT

An input voltage overload protection semiconductor structure useful with MOS circuitry consists of a p-region in an n-substrate with p+ type regions formed on both sides of the p-region and an n+ type region centrally located in the p-region. Input signals are applied to the first p+ region. The gate of an MOS structure to be protected from voltage overload is connected to the second p+ type region. A power supply used with the MOS structure is connected to the n+ region. This structure provides significantly greater load protection than the standard resistor-diode-resistor circuit.

4 Claims, 2 Drawing Figures

SEMICONDUCTOR OVERLOAD PROTECTION STRUCTURE

BACKGROUND OF THE INVENTION

This invention relates to overload protective circuits and, in particular, to semiconductor structures used to protect MOS circuits from voltage overloads.

One typically used voltage overload protection circuit is a resistor (RS) connected between an input terminal and the anode of a diode which is operated in reverse bias. The gate of an MOS structure which is to be protected from voltage overload is connected to the anode of the diode. The diode has an equivalent series resistor (RD). If a high voltage transient occurs at the input terminal, current flows through the RS and diode. As the voltage across the diode increases, a point is reached at which the diode operates in avalanche breakdown operation and the voltage there across is then essentially fixed at the breakdown voltage of the diode. The total voltage drop across the diode and RD, which determines the voltage applied to the MOS structure, is designed not to exceed the value known to damage the MOS structure to be protected.

A selection of a sufficiently high ratio of RS to RD serves to limit the voltage drop across RD. For example, assuming the diode has a breakdown potential of 35 volts and a 1200 volt surge hit the input, then the maximum voltage that can be developed across RD to insure that no more than 60 volts reaches the MOS structure to be protected is 25 volts. This requires that the ratio of RS to RD be 1200/25 or 48/1. One problem is that RD is typically approximately 100 ohms, requiring that RS be approximately 4800 ohms. Significantly, such a value of RS consumes significant amounts of silicon area.

It would be desirable to provide a relatively noncomplex semiconductor protection circuit which requires relatively little silicon area for implementation and which provides significantly greater breakdown protection than standard structures.

SUMMARY OF THE INVENTION

In accordance with an illustrative embodiment of the invention, a semiconductor structure comprises a semiconductor body having a bulk portion of a first conductivity type and containing a first surface region of a second conductivity type. A second region of the first conductivity type is contained within a portion of the first region and extends to the surface. Separate third and fourth regions of the second conductivity type are provided on opposite sides of the first region and separated from the second region, and located so as to at least be contiguous with portions of the first region. The third and fourth regions each have a portion thereof which extends to the major surface of the semiconductor body. The second, third, and fourth regions are designed to facilitate low ohmic contact thereto. The third region is adapted to serve as an input port and the fourth region is adapted to serve as an output port. The second region is typically coupled to a potential source which is typically a voltage power supply.

The above-described semiconductor structure is typically fabricated on part of the same semiconductor chip which contains the circuit which is to be protected from voltage overload. For example, if the circuitry to be protected is p-channel MOS, then the bulk portion of the semiconductor structure characteristic of the present invention is of n-type conductivity, the first region is of p-type conductivity, the second region is of n+ type conductivity, and the third and fourth regions are both of p+ type conductivity.

When the semiconductor structure is used as a voltage overload protection circuit, input signals are applied to the third region and the input terminal of the circuit to be protected is coupled to the fourth region. The second region is typically coupled to a voltage power supply which is used with the circuit to be protected. The semiconductor structure acts as a dual resistor-diode-resistor network in which the p-n junction of the first and second regions, which normally operates in reverse bias, operates in avalanche breakdown during input voltage surges. This attenuates the voltage surge which reaches the circuitry to be protected.

These and other features and advantages of the invention will be better understood from the following detailed description taken in conjunction with the accompanying drawing.

DETAILED DESCRIPTION

Figure 1:
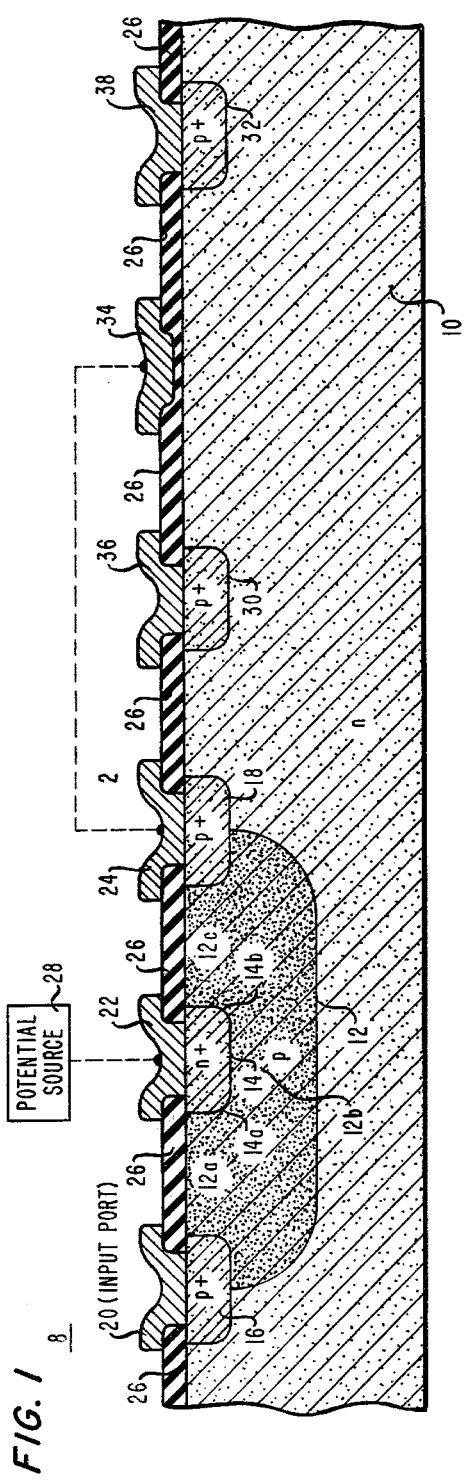
FIG. 1 illustrates a semiconductor structure in accordance with one embodiment of the invention.

Referring now to FIG. 1, there is illustrated a semiconductor structure 8 comprising an n-silicon bulk portion or substrate 10 with a p-type tub region 12 located therein which comprises portions 12a, 12b, and 12c. An n+ type region 14, having curved edges 14a and 14b, exists within region 12. First and second p+ type regions 16 and 18 are located within portions of regions 10 and 12. Region 12a is essentially that portion of region 12 between regions 14 and 16 where most of any current flow therebetween would be concentrated; region 12b is that portion of 12 essentially under region 14; and region 12c is essentially that portion of region 12 similarly between regions 14 and 18. Metal contacts 20, 22, and 24 are illustrated contacting regions 16, 14, and 18, respectively. An oxide layer 26 provides electrical isolation of the metal contacts 20, 22, and 24 from portions of the surface of structure 8. Metal contact 20 typically serves as the input port of semiconductor structure 8; metal contact 22 is typically coupled to a potential source 28. A resistor (not illustrated) can be connected by one terminal to metal contact 20. The other terminal of the resistor is then used as an input port.

Structure 8 is also illustrated comprising a p-channel transistor 28a which has p+ type drain and source regions 30 and 32 and a gate 34. The portion of silicon dioxide layer 36 under gate 34 serves as the gate oxide layer of transistor 28a. Metal contacts 36 and 38 are illustrated contacting regions 30 and 32, respectively. The dashed line illustrated coupling metal contact 24 and gate 34 exists on the surface of structure 8 as an electrical connection but is not visible in the cross-sectional view shown. Transistor 28a represents just one MOS structure of a circuit which is fabricated in substrate 10 and which is to be protected from voltage overloads.

Figure 2:
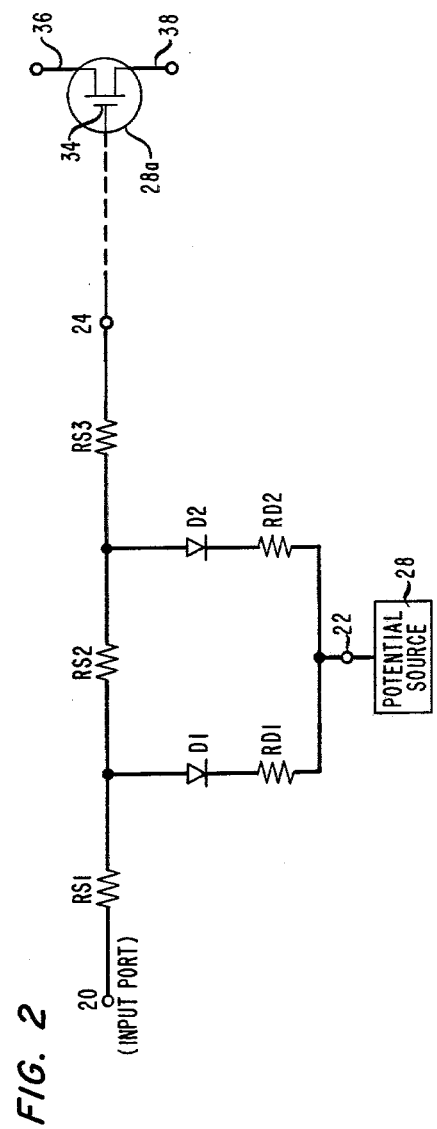
FIG. 2 illustrates an appropriate electrical equivalent circuit of the structure of FIG. 1.

Referring now to FIG. 2, there is illustrated the equivalent electrical circuit of the semiconductor structure 8 of FIG. 1. Resistor RS1 represents the resistance from metal contact 20 through region 16 and portion 12a of region 12; RS2 represents the resistance of portion 12b of region 12; and RS3 represents the resistance of portion 12c of region 12, the resistance of region 18, and the resistance of metal contact 24.

During normal operation, input signals applied to terminal 20 flow through region 16 and portions 12a, 12b, 12c of region 12, through region 18, and to metal contact 24, which is connected to gate 34 of transistor 28a. Normally, the semiconductor junction comprising p-region 12 and n+ region 14 is in reverse bias, but does not operate in avalanche breakdown.

If a voltage surge is applied to terminal 20, as may occur when a person handling structure 8 has built up a static electric charge on his body, then the p-n junction comprising regions 12 and 14 operates in avalanche breakdown. The p-n junction formed by regions 12 and 14 will first break down and operate in avalanche breakdown at curved portions 14a and 14b of region 14. Diodes D1 and D2 represent the diodes formed by regions 12 and 14 in the vicinity of portions 14a and 14b, respectively, of region 14. Resistor RD1 represents the total resistance of D1, the resistance of the portions of 12a and 12b of region 12 which are close to 14a, and the resistance of region 14 and metal contact 22. RD2 represents the total resistance of D2, the resistance of the portions of 12b and 12c of region 12 which are close to 14b, and the resistance of region 14 and metal contact 22.

If an overload voltage does occur at terminal 20, D1 and D2 both operate in avalanche breakdown so as to short most of the overload voltage to terminal 22 and thus protect transistor 28a, which is connected to terminal 24, from a voltage overload which can destroy it.

An embodiment of structure 8, which has been fabricated on the same semiconductor chip as an MOS circuit which is to be protected, has predominant impurity concentrations of substrate 10, regions 12, 14, 16, and 18 of $10^{15}$, $1.2 \times 10^{16}$, $5 \times 10^{19}$, $10^{19}$, and $10^{19}$ impurities/cm$^3$, respectively. Region 12 has a vertical depth of approximately 8 microns and a width at the bottom of approximately 70 microns. Regions 14, 16, and 18 each have a vertical depth of approximately 1.5 microns and a width of approximately 15 microns. The spacing on the surface between regions 14 and 16 and between regions 14 and 18 is approximately 12 microns in each instance. The nominal values of RS1, RS2, and RS3 are approximately 600, 800, and 600 ohms, respectively; and RD1 and RD2 are both approximately 100 ohms. The breakdown voltage of diodes D1 and D2 is approximately 35 volts. The potential source coupled to metal contact 22 is +12 volts. A 200 ohm polysilicon resistor is used in series with metal contact 20. This resistor is used to provide a current limiting path such that if a positive voltage of +12.6 or greater is applied to structure 8, the resulting current flow via forward biased p-n junctions by region 16 and substrate 10 and regions 16 and 14 is limited by the series polysilicon resistor.

With a 1200 volt transient voltage applied to structure 8 through the 200 ohm resistor, the measured voltage at metal contact 24 is approximately 55 volts. This potential is below that which would destroy the gate oxide of the MOS transistor connected thereto.

It is to be understood that the embodiments described herein are merely illustrative of the general principles of the invention. Various modifications are possible within the scope thereof. For example, if the MOS transistor to be protected is fabricated with a p-substrate, then regions 12, 16, and 18 are n-type silicon and region 14 is a p-type silicon. Still further, additional voltage overload protection is easily obtained by the use of one or more other n+ type spaced regions, like region 14, within region 12. This results in essentially two extra diodes per extra n+ diffusion which approximately doubles the voltage overload protection. Still further, the breakdown voltage of the diodes can be made lower so as to provide even greater protection. Additionally, the p-type region 12 can be enlarged to enclose completely each of the regions 16 and 18 except for their top surfaces where electrodes 20 and 24 are provided.

I claim:

1. A semiconductor structure comprising:
   a semiconductor body having a major surface and including a bulk portion of a first conductivity type;
   a first region located within the semiconductor body and extending to the major surface and being of a second conductivity type;
   a second region located within the first region and extending to the major surface and being of the first conductivity type; and
   third and fourth regions within the body each contiguous with at least portions of the first region and extending to the major surface and being of the second conductivity type;
   the third and fourth regions being of higher impurity concentration than the second region and being separated from each other and from the second region;
   the third region having an electrode coupled thereto which serves as an input port;
   the fourth region having an electrode coupled thereto which serves as an output port; and
   the second region having an electrode coupled thereto.

2. The apparatus of claim 1 wherein the semiconductor body and second region are both of n-type conductivity and the first, third, and fourth regions are of p-type conductivity.

3. A structure for inclusion in a semiconductor body having a circuit which is to be protected and having a major surface and a bulk portion of a first conductivity type comprising:
   a first region located within a portion of the semiconductor body and extending to the major surface and being of a second conductivity type;
   a second region located within a portion of the first region and extending to the major surface and being of the first conductivity type;
   third and fourth regions contiguous with at least portions of the first region and extending to the major surface and being of the second conductivity type;
   the third and fourth regions being of higher impurity concentration than the second region and being separated from each other and from the second region; and
   the second, third and fourth regions each having a separate electrode coupled thereto;
   the electrode coupled to the third region serving as an input port; and
   the electrode coupled to the fourth region being coupled to the circuit.

4. Monolithic semiconductor apparatus comprising a protective portion and a functional portion including at least one MOS structure in which the protective portion comprises:

a bulk portion of one conductivity type;

a first region of the opposite conductivity type within the bulk portion and extending in part to a connecting surface;

a second region of the one conductivity type within the first region and extending in part to the connecting surface;

separate third and fourth regions of the opposite conductivity type and of higher conductivity than the first region and spaced apart on opposite sides of the second region, each being contiguous with at least part of said first region and extending in part to the connecting surface;

electrode means coupled to the third region for receiving input signals;

electrode means coupled to the second region for receiving operating potentials; and means for providing a low resistance path between the fourth region and an input terminal of the MOS structure of the functional portion.

* * * * *